US012796033B2

(12) United States Patent
Buckley et al.

(10) Patent No.: US 12,796,033 B2
(45) Date of Patent: Nov. 10, 2026

(54) VERTICAL- STRUCTURE FIELD EFFECT TRANSISTOR HAVING A III-N SEMICONDUCTOR LAYER WITH FACE HAVING A POLARITY OF THE NITROGEN TYPE AND A CHANNEL LAYER FORMING A HETEROSTRUCTURE WITH A DRIFT LAYER

(71) Applicant: COMMISSARIAT A L'ENERGIE ATOMIQUE ET AUX ENERGIES ALTERNATIVES, Paris (FR)

(72) Inventors: Julien Buckley, Grenoble Cedex (FR); Matthew Charles, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 895 days.

(21) Appl. No.: 17/705,814

(22) Filed: Mar. 28, 2022

(65) Prior Publication Data

US 2022/0310790 A1 Sep. 29, 2022

(30) Foreign Application Priority Data

Mar. 29, 2021 (FR) ...................................... 2103210

(51) Int. Cl.
*H10D 62/17* (2025.01)
*H10D 30/01* (2025.01)
(Continued)

(52) U.S. Cl.
CPC ......... *H10D 62/235* (2025.01); *H10D 30/025* (2025.01); *H10D 30/63* (2025.01); *H10D 62/393* (2025.01); *H10D 62/8503* (2025.01)

(58) Field of Classification Search
CPC .... H10D 62/235; H10D 30/025; H10D 30/63; H10D 62/393; H10D 62/8503;
(Continued)

(56) References Cited

U.S. PATENT DOCUMENTS 9,105,689 B1 8/2015 Fanelli
2009/0179258 A1 7/2009 Otake
(Continued)

FOREIGN PATENT DOCUMENTS

EP 1587147 A2 * 10/2005 .......... H01L 29/165
JP 2009-188041 A 8/2009
WO WO 2005/065385 A2 7/2005

OTHER PUBLICATIONS

S. Arulkumaran, T. Egawa, H. Ishikawa, T. Jimbo; Characterization of different-AI-content AlxGax-1N/GaN heterostructures and high-electron-mobility transistors on sapphire. J. Vac. Sci. Technol. B Mar. 1, 2003; 21 (2): 888-894. (Year: 2003).*
(Continued)

*Primary Examiner* — William B Partridge
*Assistant Examiner* — John Patrick Cornely
(74) *Attorney, Agent, or Firm* — CUSHMAN PARTNERS LLC

(57) ABSTRACT

A field-effect transistor includes a III-N semiconductor layer including a first face and a second face opposite the first face, the first face having a polarity of the nitrogen (N) type; a drift layer disposed on the first face of the III-N semiconductor layer; a channel layer disposed on the drift layer and forming a heterostructure with the drift layer; a gate structure extending to the drift layer through the channel layer; a source electrode disposed on the channel layer; and a drain electrode disposed on the second face of the III-N semiconductor layer.

13 Claims, 9 Drawing Sheets

(51) Int. Cl.
*H10D 30/63* (2025.01)
*H10D 62/85* (2025.01)

(58) Field of Classification Search
CPC ............ H10D 30/0297; H10D 30/668; H10D 62/405; H10D 62/824; H10D 64/513
See application file for complete search history.

(56) References Cited

U.S. PATENT DOCUMENTS

| | | | | |
|---|---|---|---|---|
| 2013/0146885 | A1 | 6/2013 | Brown et al. | |
| 2013/0175538 | A1 | 7/2013 | Choi et al. | |
| 2017/0229569 | A1* | 8/2017 | Chowdhury | H10D 30/4755 |
| 2020/0388702 | A1* | 12/2020 | Hwang | H10D 30/611 |

OTHER PUBLICATIONS

Bedell, S. W., et al., "Kerf-Less Removal of Si, Ge, and III-V Layers by Controlled Spalling to Enable Low-Cost PV Technologies," IEEE Journal of Photovoltaics, vol. 2, No. 2, Apr. 2012, pp. 141-147.

Oka, T., et al., "1.8 m $\Omega cm^2$ vertical GaN-based trench metal-oxide-semiconductor field-effect transistors on a free-standing GaN substrate for 1.2-kV-class operation," Applied Physics Express, vol. 8, 054101, (2015), 4 pages.

Quay, R., "2.2 Polar Semiconductors for Electronics," Gallium Nitride Electronics, pp. 29-30, Published by Springer Science & Business Media, Apr. 2008.

Ruzzarin, M., et al., "Gate Stability and Robustness of In-Situ Oxide GaN Interlayer Based Vertical Trench MOSFETs (OG-FETs)," IEEE, (2019), 5 pages.

Shibata, D., et al., "1.7 kV / 1.0 m$\Omega cm^2$ Normally-off Vertical GaN Transistor on GaN substrate with Regrown p-GaN/AlGaN/GaN Semipolar Gate Structure," IEEE, (2016), pp. 248-251.

Tanaka, R., et al., "Demonstration of 1200 V/1.4 m$\Omega cm^2$ vertical GaN planar MOSFET fabricated by an all ion implantation process," Japanese Journal of Applied Physics, vol. 59, SGGD02, (2020), 6 pages.

Wong, M. H., et al., "N-polar GaN epitaxy and high electron mobility transistors," Semiconductor Science and Technology, vol. 28, (2013), 074009 (22pp).

Zhang, Y., et al., "(Ultra) Wide-Bandgap Vertical Power FinFETs," IEEE Transactions on Electronic Devices. vol. 67, No. 10, Oct. 2020, pp. 3960-3971.

* cited by examiner

[Fig. 1]
PRIOR ART
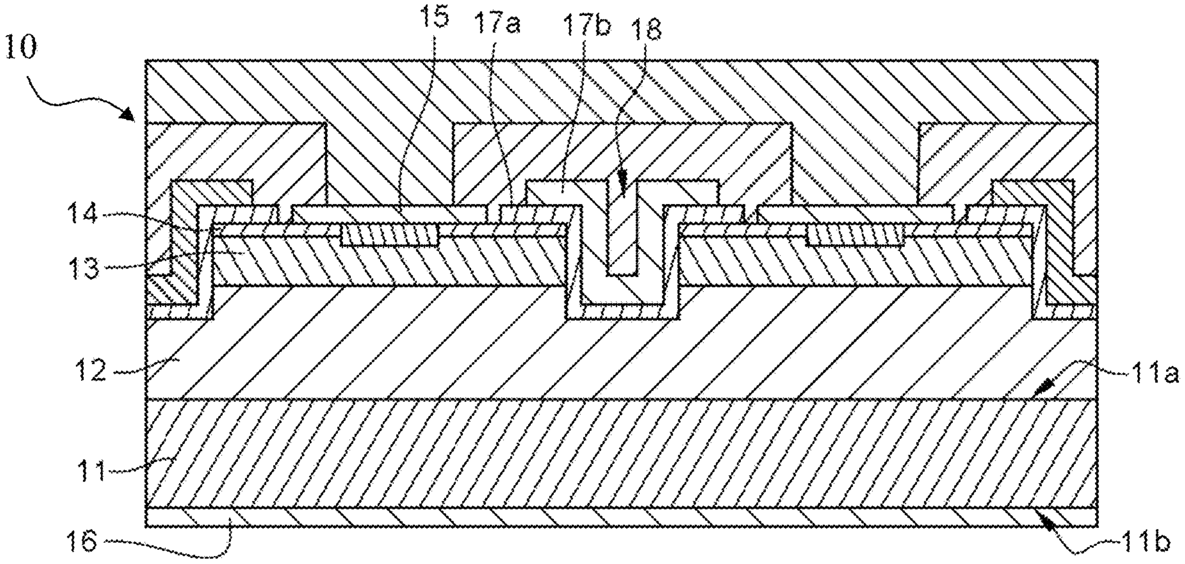
[Fig. 2]
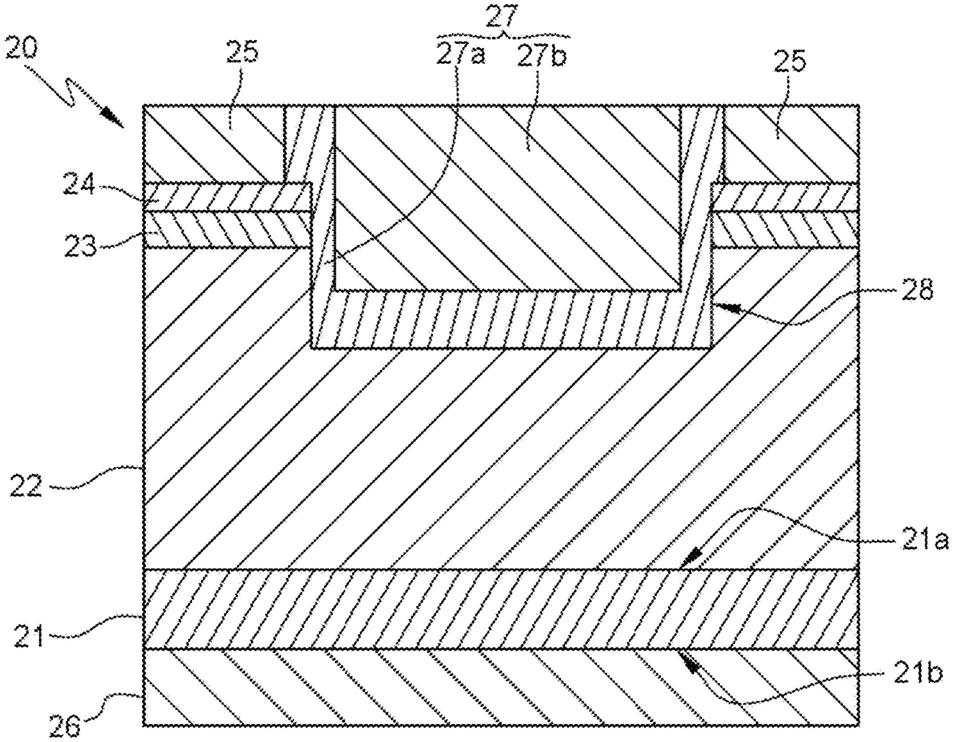

[Fig. 3]
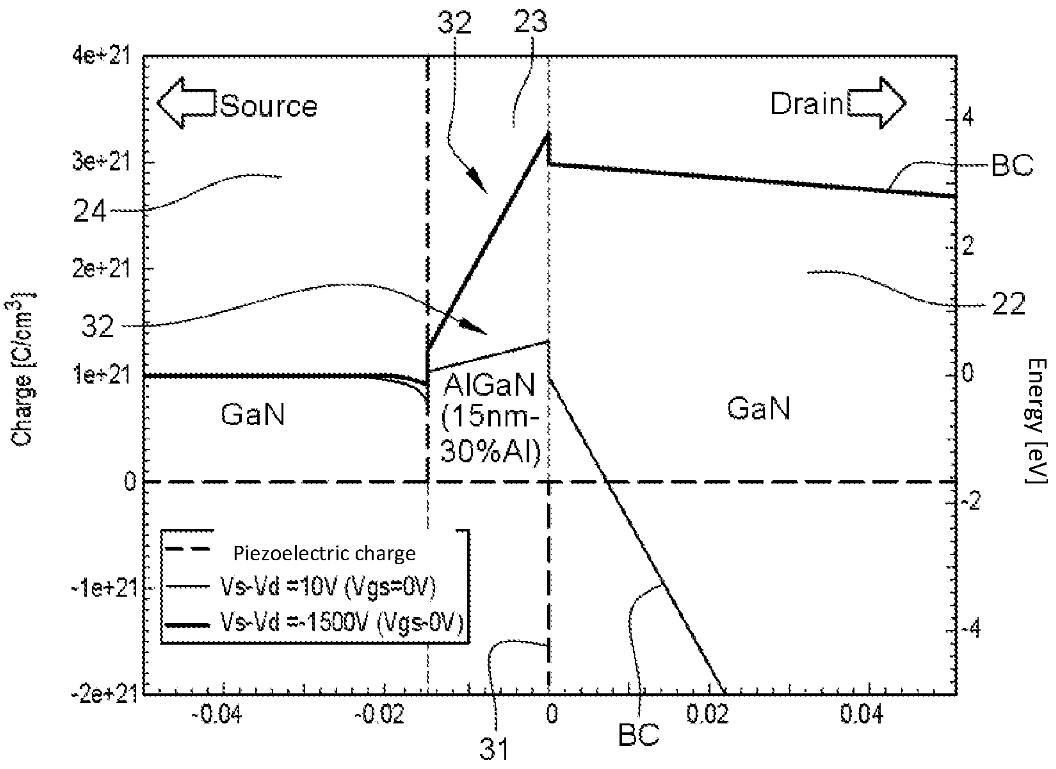
[Fig. 4]
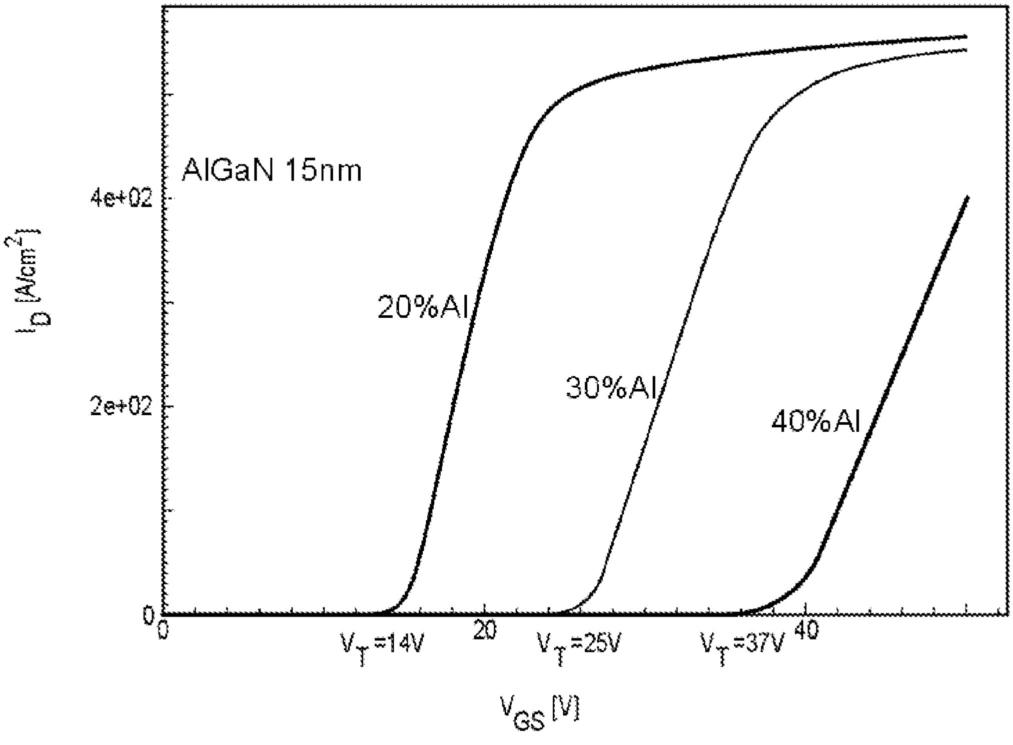

[Fig. 5]
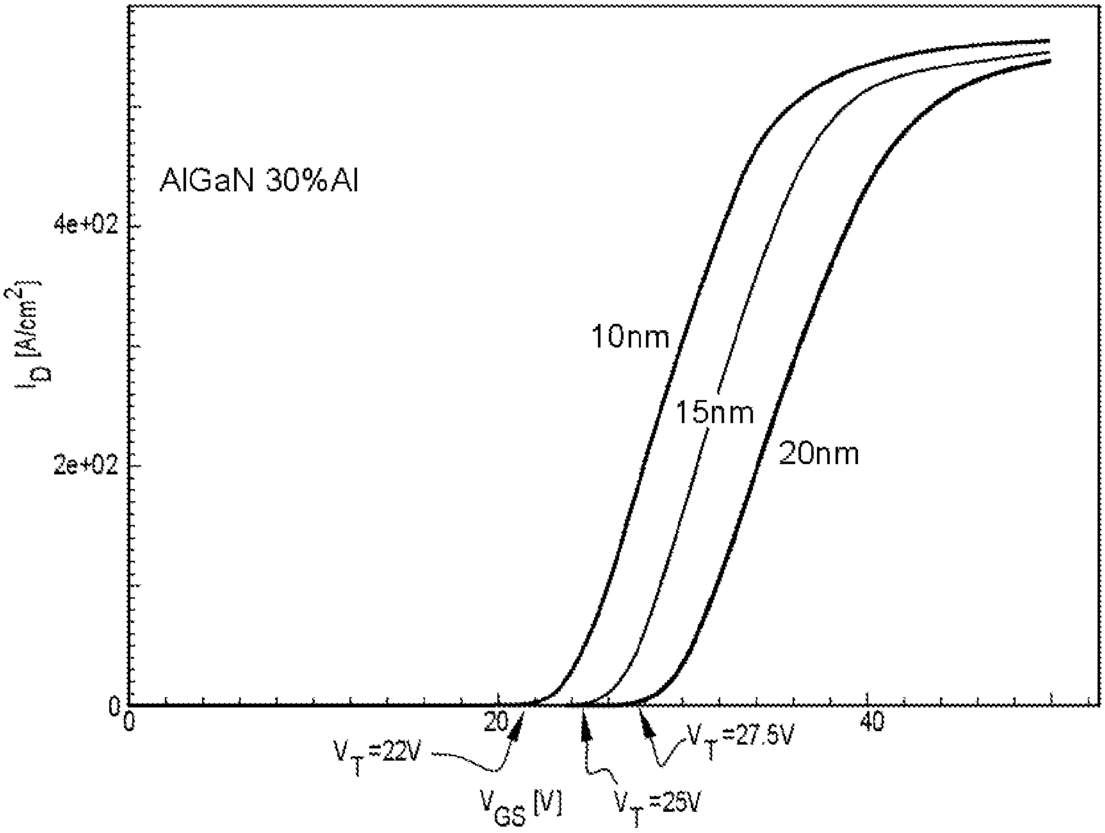
[Fig. 6A]
-S11-
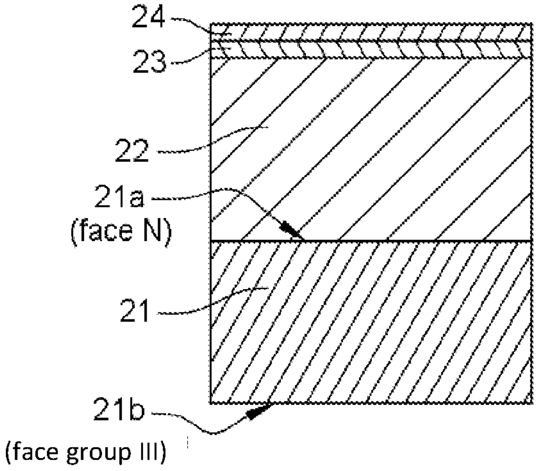

[Fig. 6B]
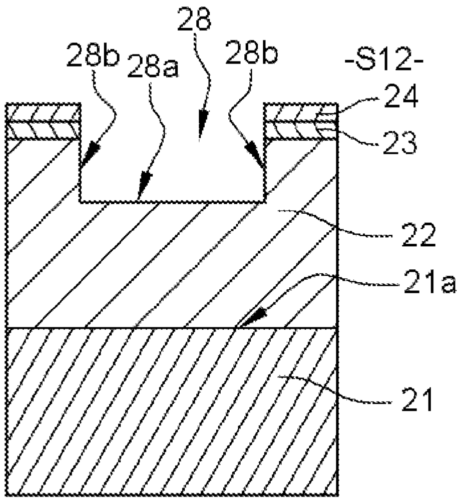
[Fig. 6C]
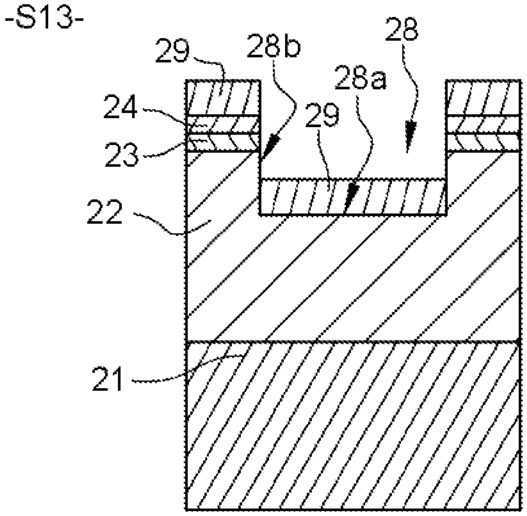

[Fig. 6D]
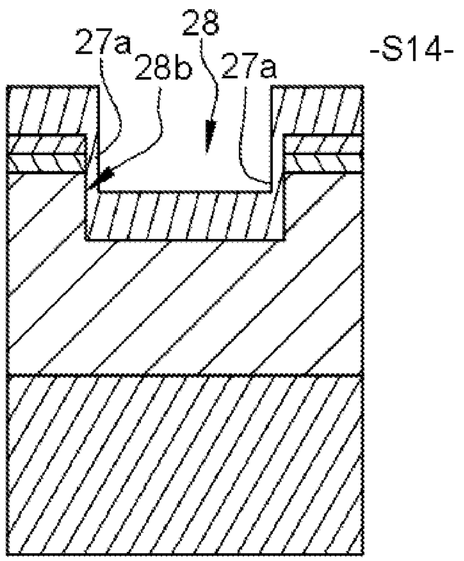
[Fig. 6E]
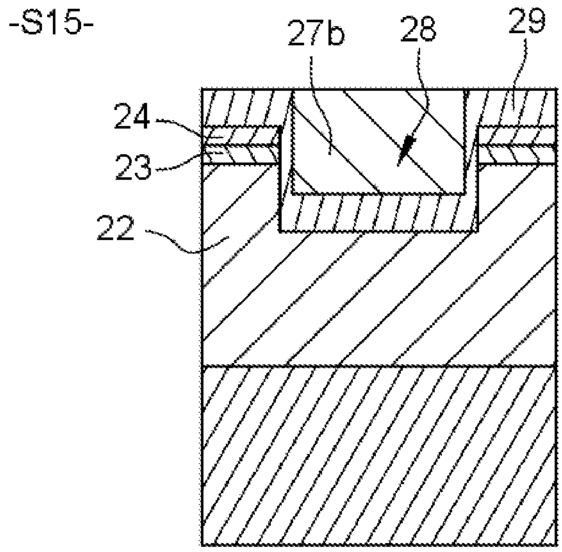

[Fig. 6F]
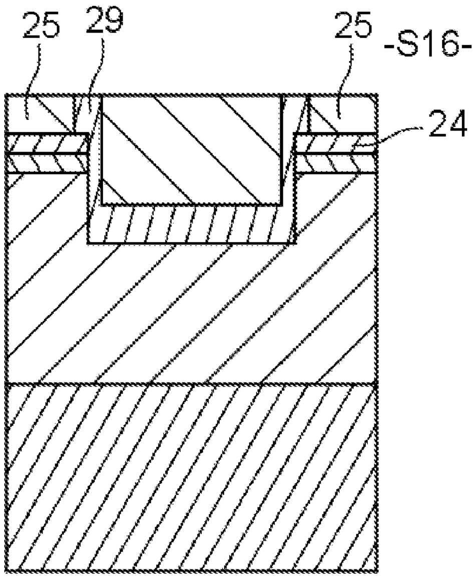
[Fig. 6G]
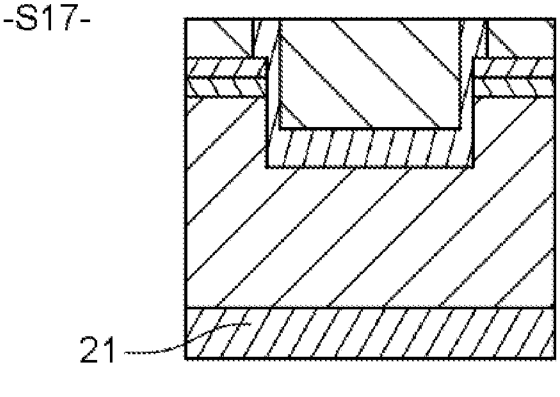

[Fig. 6H]
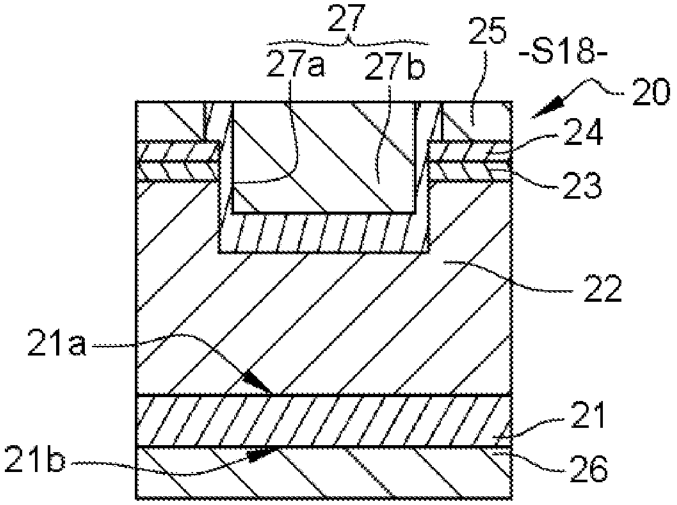
[Fig. 7A]
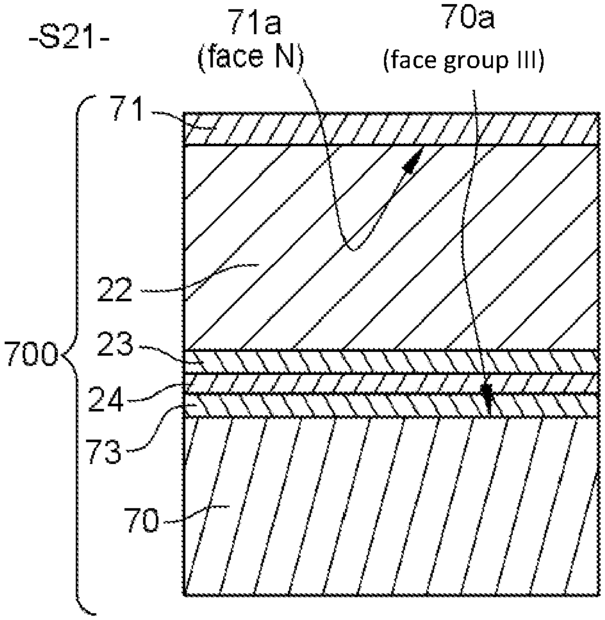

[Fig. 7B]
-S22-
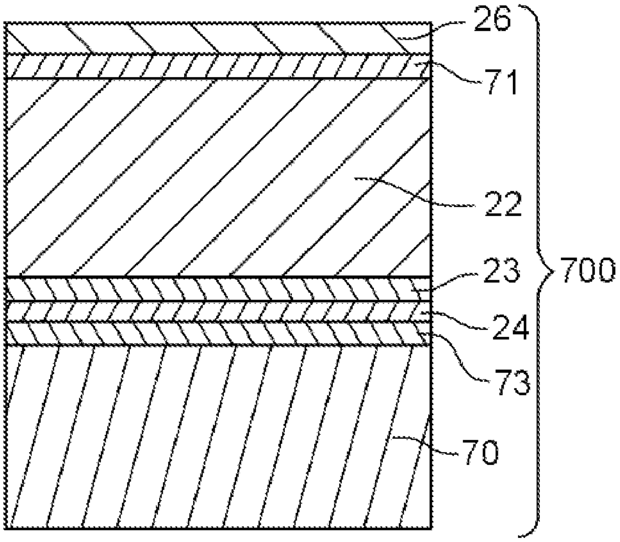
[Fig. 7C]
-S23-
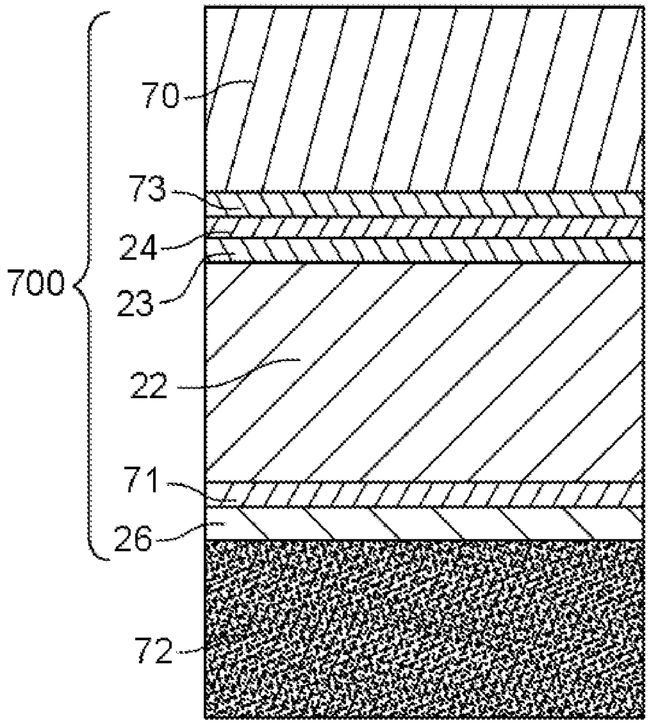

[Fig. 7D]
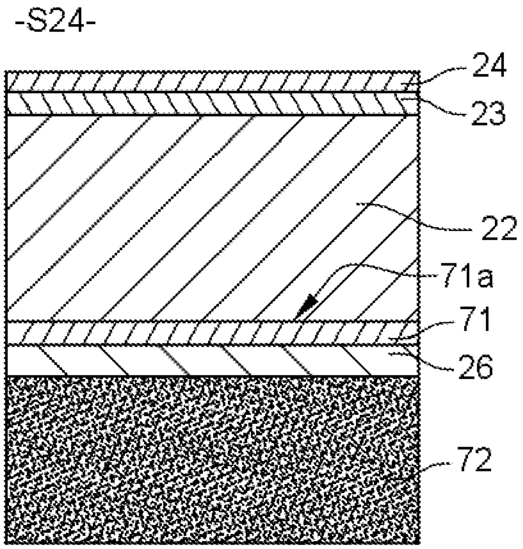

VERTICAL- STRUCTURE FIELD EFFECT TRANSISTOR HAVING A III-N SEMICONDUCTOR LAYER WITH FACE HAVING A POLARITY OF THE NITROGEN TYPE AND A CHANNEL LAYER FORMING A HETEROSTRUCTURE WITH A DRIFT LAYER

CROSS-REFERENCE TO RELATED APPLICATIONS

This application claims priority to French Patent Application No. 2103210, filed Mar. 29, 2021, the entire content of which is incorporated herein by reference in its entirety.

TECHNICAL FIELD

The technical field of the invention is that of power electronics. The present invention relates to a vertical-structure field-effect transistor, manufactured from a substrate made of III-N semiconductor material such as gallium nitride (GaN).

PRIOR ART

A high electron mobility transistor (or HEMT) is a field-effect transistor that benefits from the conductive properties of a 2-dimensional electron gas (or 2DEG). It comprises a vertical stack of III-N semiconductor layers on a substrate, typically made of silicon, silicon carbide or sapphire. The 2-dimensional electron gas is formed by a heterojunction between a channel layer, typically made of gallium nitride (GaN), and a barrier layer, typically made of aluminium gallium nitride (AlGaN).

This heterojunction transistor is qualified as a lateral-structure transistor, because the source electrode, the drain electrode and the gate electrode of the transistor are disposed on the same side of the substrate, the source electrode and the drain electrode being located on either side of the gate electrode.

The HEMT supports high current densities in the ON state, due to the high density of charge carriers and the great mobility of these carriers in the 2-dimensional electron gas. It can also have a high switching speed.

On the other hand, it has a relatively low threshold voltage, generally comprised between 1 V and 3 V, which is insufficient for certain applications, such as high-power automobile applications for example. Moreover, in order to obtain good voltage resistance in the OFF state, in other words a high breakdown voltage, substantial spacing between the gate electrode and the drain electrode is required, which increases the size of the transistor.

A vertical-structure GaN transistor can on the contrary have a high breakdown voltage without increasing the surface of the component, by adjusting the thickness of an active layer called the drift layer. This type of transistor is generally formed from a self-supporting substrate made of GaN.

The document ["1.8 mΩ·cm$^2$ vertical GaN-based trench metal-oxide-semiconductor field-effect transistors on a free-standing GaN substrate for 1.2-kV-class operation", Tohru Oka and al., Appl. Phys. Express 8, 054101, 2015] describes an example of a vertical GaN transistor, of the trench-MOSFET type.

In reference to FIG. 1, this transistor 10 comprises a substrate 11 made of heavily n-doped GaN ($n^+$-GaN), a drift layer 12 made of lightly n-doped GaN ($n^-$-GaN) disposed on a first face 11*a* of the substrate 11, a channel layer 13 made of p-doped GaN (p-GaN) disposed on the drift layer 12 and a source contact layer 14 made of heavily n-doped GaN ($n^+$-GaN) disposed on the channel layer 13. A source electrode 15 is disposed on the source contact layer 14, while a drain electrode 16 is disposed on a second opposite face 11*b* of the substrate 11. Finally, a gate dielectric layer 17*a* and a gate electrode 17*b* are disposed at the bottom and against the side walls of a trench 18. The trench 18 extends to the drift layer 12 through the channel layer 13 and the source contact layer 14.

The transistor 10 of FIG. 1 has a high breakdown voltage, of about 1.2 kV, and a reduced size. On the other hand, its threshold voltage is limited to 3.5 V despite a high concentration of dopants in the channel layer 13 made of p-GaN.

SUMMARY OF THE INVENTION

It is therefore observed that the need for a power transistor having a high threshold voltage is not satisfied.

According to a first aspect of the invention, this need tends to be satisfied by providing a field-effect transistor comprising:

- a III-N semiconductor layer comprising a first face and a second face opposite the first face;
- a drift layer disposed on the first face of the III-N semiconductor layer;
- a channel layer disposed on the drift layer;
- a gate structure extending to the drift layer through the channel layer;
- a source electrode disposed on the channel layer; and
- a drain electrode disposed on the second face of the III-N semiconductor layer.

This vertical-structure transistor is remarkable in that the first face of the layer of III-N semiconductor material has a polarity of the nitrogen (N) type and in that the channel layer forms a heterostructure with the drift layer.

By successively disposing the drift layer and the channel layer on the nitrogen face of the layer of III-N semiconductor material (rather than the gallium face in the example of a substrate made of GaN), a negative piezoelectric charge is formed at the interface between the drift layer and the channel layer. This negative charge has for effect to raise the conduction band at this interface, creating a high barrier potential that opposes the passing of the current. This results in a significant increase in the threshold voltage of the transistor.

A III-N semiconductor material designates a material from the nitride family comprising (in addition to nitrogen) one or more elements of group 13 (column IIIA in the North American CAS system) of the periodic table of the elements.

The III-N semiconductor layer can be made of gallium nitride (GaN) or of aluminium gallium nitride (AlGaN).

In a preferred embodiment of the transistor, the drift layer is made of n-doped gallium nitride (GaN) and the channel layer is made of p-doped or unintentionally doped aluminium gallium nitride (AlGaN).

According to a development of this preferred embodiment, the aluminium gallium nitride (AlGaN) of the channel layer has a percentage of aluminium comprised between 20% and 40%.

According to another development, the channel layer has a thickness comprised between 10 nm and 20 nm.

In an alternative embodiment, the drift layer is made of n-doped aluminium gallium nitride (AlGaN) and the channel layer is made of p-doped or unintentionally doped aluminium nitride (AlN).

In another alternative embodiment, the drift layer is made of n-doped aluminium gallium nitride (AlGaN) and the channel layer is made of p-doped or unintentionally doped aluminium gallium nitride (AlGaN) and having a percentage of aluminium greater than that of the drift layer.

The transistor according to the first aspect of the invention can also have one or more of the characteristics hereinbelow, taken individually or in any technically permissible combination:

- the III-N semiconductor material is preferably n-type doped;
- the drain electrode is in electrical contact with the III-N semiconductor layer;
- the source electrode is in electrical contact with the channel layer;
- the transistor further comprises a source contact layer disposed between the channel layer and the source electrode;
- the source contact layer is made of n-type doped gallium nitride (GaN); and
- the source contact layer forms a heterostructure with the channel layer.

A second aspect of the invention relates to a method for manufacturing a field-effect transistor, comprising the following steps:

- providing a substrate made of a III-N semiconductor material, the substrate comprising a first face having a polarity of the nitrogen (N) type and a second face opposite the first face;
- forming successively by epitaxy a drift layer and a channel layer on the first face of the substrate, the channel layer forming a heterostructure with the drift layer;
- forming a gate structure extending to the drift layer through the channel layer;
- forming a source electrode on the channel layer; and
- forming a drain electrode on the second face of the substrate.

The method can further comprise a step of thinning the substrate before the step of forming the drain electrode.

A third aspect of the invention relates to a method for manufacturing a field-effect transistor, comprising the following steps:

- providing a growth substrate comprising a layer made of a III-N semiconductor material, the growth substrate comprising a first face having a polarity of the group III type;
- forming a stack by successively growing by epitaxy a channel layer, a drift layer and a III-N semiconductor layer on the first face of the growth substrate, the channel layer forming a heterostructure with the drift layer;
- depositing at least one metal layer on the III-N semiconductor layer to form a drain electrode;
- turning over the stack and gluing it to a transfer substrate on the side of the drain electrode;
- removing the growth substrate;
- forming a gate structure extending to the drift layer through the channel layer; and
- forming a source electrode on the channel layer.

The transfer substrate is advantageously made of metal.

Preferably, the stack further comprises a barrier layer formed by epitaxy on the first face of the growth substrate before the channel layer. The barrier layer is for example made of aluminium gallium nitride (AlGaN).

The invention and its different applications shall be better understood when reading the following description and when examining the accompanying figures.

BRIEF DESCRIPTION OF THE FIGURES

Other characteristics and advantages of the invention shall appear clearly in the description of it which is given hereinbelow, for the purposes of information and in no way limiting, in reference to the following figures:

FIG. 1, described hereinabove, is a cross-section view of a field-effect transistor according to the prior art;

FIG. 2 diagrammatically shows a field-effect transistor according to the first aspect of the invention;

FIG. 3 shows the energy of the conduction band under two different polarisation voltages $V_{DS}$ and the piezoelectric charge in an example of a transistor according to FIG. 2;

FIG. 4 shows $I_D$-$V_{GS}$ characteristics of an example of a transistor according to FIG. 2, with these characteristics corresponding to different percentages of aluminium in a channel layer made of AlGaN;

FIG. 5 shows $I_D$-$V_{GS}$ characteristics of an example of a transistor according to FIG. 2, with these characteristics corresponding to different thicknesses of a channel layer made of AlGaN;

FIGS. 6A to 6H show steps of a method of manufacturing the field-effect transistor according to the second aspect of the invention; and FIGS. 7A to 7D show steps of a method of manufacturing the field-effect transistor according to the third aspect of the invention.

For increased clarity, identical or similar elements are marked with identical reference signs on all the figures.

DETAILED DESCRIPTION

FIG. 2 is a diagrammatical cross-section view of a field-effect transistor 20 according to an aspect of the invention. This type of transistor has advantageous applications in power electronics, for example as a power switch in voltage step-down or step-up converters ("buck" or "boost" converters) or DC-AC converters. The transistor can thus reversibly switch between a first state called "passing state" (or "ON state") and a second state called "blocked state" (or "OFF state").

The field-effect transistor 20 comprises:

- a III-N semiconductor layer 21 having a first face 21*a* and a second face 21*b* opposite the first face 21*a*,
- a drift layer 22 disposed on the first face 21*a* of the III-N semiconductor layer 21;
- a channel layer 23 disposed on the drift layer 22;
- a source electrode 25 disposed on the channel layer 23;
- a drain electrode 26 disposed on the second face 21*b* of the III-N semiconductor layer 21; and
- a gate structure 27 extending to the drift layer 22 through the channel layer 23.

The III-N semiconductor layer 21 is constituted of a first III-N semiconductor material with a hexagonal mesh structure, for example gallium nitride (GaN) or aluminium gallium nitride (AlGaN) (the aluminium atoms substituting for a portion of the gallium atoms in the AlGaN). The first face 21*a* has a polarity of the nitrogen (N) type, while the second face 21*b* has a polarity of the group III type (gallium, aluminium, indium . . . ). The notion of polarity is described in detail in the reference work ["*Gallium nitride electronics*", Rüdiger QUAY, Springer Science & Business Media, pp. 29-30, 2008].

The III-N semiconductor layer 21 can be a self-supporting substrate made of III-N semiconductor material or a solid substrate made of III-N semiconductor material, on which the drift layer 22 and the channel layer 23 were successively formed. A self-supporting substrate is obtained by epitaxy of a thick layer on a growth substrate then removal of the growth substrate, while a solid substrate is obtained by drawing and cutting a lingot. Alternatively, the III-N semiconductor layer 21 can be an epitaxial layer on a growth substrate, this growth substrate being removed only after the formation of the drift layer 22 and the channel layer 23. The growth substrate is for example made of sapphire, silicon carbide or silicon.

With a concern for simplification, the term "substrate" will be used in what follows to designate the III-N semiconductor layer 21 of the transistor 20.

The first III-N semiconductor material is preferably n-type doped. The concentration in n-type doping impurities (for example silicon atoms) of the substrate 21 is preferably comprised between $10^{17}$ cm$^{-3}$ and $10^{20}$ cm$^{-3}$, for example equal to $10^{18}$ cm$^{-3}$.

The transistor 20 has a vertical structure, because the source electrode 25 and the drain electrode 26 are disposed on either side of the substrate 21.

The drift layer 22, also called a voltage resistance layer, is constituted of a second III-N semiconductor material, for example gallium nitride (GaN) or aluminium gallium nitride (AlGaN). The second III-N semiconductor material, which can be identical or different from the first III-N semiconductor material (substrate 21), is preferably n-type doped. The concentration in n-type doping impurities of the drift layer 22 is advantageously less than that of the substrate 21. It is preferably comprised between $10^{14}$ cm$^{-3}$ and $10^{17}$ cm$^{-3}$, for example equal to $10^{16}$ cm$^{-3}$. The thickness of the drift layer 22 is advantageously greater than 10 μm so as to provide the transistor 20 with good voltage resistance (drain-source voltage $V_{DS}$), for example of at least 1000 V.

The channel layer 23 is the layer in which the conducting channel of the transistor 20 is formed, along a flank of the gate structure 27. It is constituted of a third III-N semiconductor material and forms a heterostructure with the drift layer 22. The third III-N semiconductor material (channel layer 23) therefore has a band-gap width that is different from that of the second III-N semiconductor material (drift layer 22). The band-gap width of the third III-N semiconductor material is advantageously greater than that of the second III-N semiconductor material, so as to create a potential barrier (due to the drift of the conduction bands), also called tunnel barrier, in the direction of the circulation of the charge carriers, here electrons coming from the source and moving in the direction of the drain. The third III-N semiconductor material can be p-type doped or unintentionally doped. The thickness of the channel layer 23 can be comprised between 10 nm and 30 nm.

In a preferred embodiment of the transistor 20, the drift layer 22 is made of n-doped GaN ($10^{14}$ cm$^{-3}$-$10^{17}$ cm$^{-3}$) and the channel layer 23 is made of p-doped or unintentionally doped AlGaN. The substrate 21 is advantageously made of n-doped GaN ($10^{17}$ cm$^{-3}$-$10^{20}$ cm$^{-3}$) in order to minimise the growth defects in the drift layer 22 made of n-GaN.

In an alternative embodiment, the drift layer 22 is made of n-doped AlGaN ($10^{14}$ cm$^{-3}$-$10^{17}$ cm$^{-3}$) and the channel layer 23 is made of p-doped or unintentionally doped aluminium nitride (AlN). In another alternative embodiment, the drift layer 22 is made of n-doped AlGaN ($10^{14}$ cm$^{-3}$-$10^{17}$ cm$^{-3}$) and the channel layer 23 is made of p-doped or unintentionally doped AlGaN with a concentration in aluminium greater than that of the drift layer 22. In these two alternative embodiments, the substrate 21 is advantageously made of n-doped AlGaN ($10^{17}$ cm$^{-3}$-$10^{20}$ cm$^{-3}$) in order to minimise the growth defects in the drift layer 22 made of n-AlGaN.

Advantageously, the transistor 20 further comprises a source contact layer 24 disposed between the channel layer 23 and the source electrode 25. The source contact layer 24 improves the quality of the electrical contact between the channel layer 23 and the source electrode 25.

The source contact layer 24 is preferably constituted of a fourth n-doped III-N semiconductor material, preferably at a concentration comprised between $10^{18}$ cm$^{-3}$ and $10^{20}$ cm$^{-3}$ so as to form a weakly resistive contact (ohmic) with the source electrode 25. The source contact layer 24 can form a second heterostructure with the channel layer 23. The fourth III-N semiconductor material is then different from the third III-N semiconductor material (channel layer 23). It is preferably identical to the first III-N semiconductor material (substrate 21).

In the absence of the source contact layer 24, the source electrode 25 is in direct contact with the channel layer 23.

The gate structure 27 of the transistor 20 is preferably a MOS (Metal-Oxide-Semiconductor) gate structure. It comprises a gate dielectric layer 27*a* and a gate electrode 27*b* separated from the channel layer 23 (and from the source contact layer 24, where applicable) by the gate dielectric layer 27*a*. The transistor 20 is then a metal-oxide-semiconductor (MOSFET) field-effect transistor, here with a n channel (n-MOSFET) given the type of conductivity of the substrate 21 (drain side) and of the source contact layer 24 (source side).

The gate dielectric layer 27*a* is for example made of silicon dioxide ($SiO_2$). The gate electrode 27*b* is preferably made of metal, for example of titanium nitride (TiN).

The gate structure 27 is disposed in a trench 28, that extends to the drift layer 22 through the channel layer 23, and where applicable, the source contact layer 24 (this is then referred to as "trench-MOSFET").

The source electrode 25 and the gate electrode 27*b* can each contain several portions. The portions of the same electrode are electrically connected together in order to be subjected to the same electrical potential. With a concern for clarity, only a portion of the gate electrode 27*a* and two portions of the source electrode 25, disposed on either side of the portion of the gate electrode 27*a*, were shown in FIG. 2. The portions of the source electrode 25 are advantageously nested with the portions of the gate electrode 27*a* so as to decrease the resistance of the transistor 20 in the ON state. Several arrangements are possible for the source electrode 25 and the gate electrode 27*b*: interdigitated combs, hexagonal cell structures as described in the document ["1.8 mΩ·cm$^2$ vertical GaN-based trench metal-oxide-semiconductor field-effect transistors on a free-standing GaN substrate for 1.2-kV-class operation", Tohru Oka and al., Appl. Phys. Express 8, 054101, 2015].

Like the source electrode 25 with the channel layer 23, the drain electrode 26 is in electrical contact (ohmic) with the substrate 21 made of III-N semiconductor material. The source electrode 25 and the drain electrode 26 are preferably made of metal, for example of TiN or TiN on Ti (bilayer).

A particularity of the field-effect transistor 20 is that the drift layer 22, the channel layer 23 and the source contact layer 24 (when the latter is desired) are stacked on the N polarity face of the substrate 21, rather than on the Ga polarity face as in the vertical GaN transistors of the prior art.

FIG. 3 shows the impact of the polarisation of the substrate 21 on the piezoelectric charge and the diagram of the conduction band in an example of a transistor 20 comprising a drift layer 22 made of n-GaN, a channel layer 23 made of AlGaN (15 nm thick and 30% aluminium) and a source contact layer 24 made of n-GaN.

A negative piezoelectric charge 31 is formed at the interface between the drift layer 22 (made of GaN) and the channel layer 23 (made of AlGaN), in other words at the heterojunction. The electric field induced by this negative interface charge raises the conduction band BC at the interface, thus creating a potential barrier 32 that opposes the circulation of the electrons (from the source to the drain) when the transistor 20 is in the OFF state ($V_{GS}<V_T$, for example $V_{GS}=0$ in FIG. 3). The height of the potential barrier 32 is significant, of about several electron-volts, at a null or negative drain source voltage $V_{DS}$ (for example equal to −10 V) and remains present at a high positive voltage $V_{DS}$ (for example equal to 1500 V). Thus, a blocking of the transistor can be provided even under a high voltage $V_{DS}$.

The increase in the potential barrier 32 results in a significant increase in the threshold voltage $V_T$ of the transistor, i.e. the gate-source voltage $V_{GS}$ from which the transistor becomes ON.

FIG. 4 shows the drain current ID according to the gate-source voltage $V_{GS}$ of the transistor 20, for several values of the aluminium rate in the channel layer 23 made of AlGaN (and a constant thickness of 15 nm). FIG. 5 shows the drain current $I_D$ according to the gate-source voltage $V_{GS}$ of the transistor 20, for several thickness values of the channel layer 23 made of AlGaN (and a constant aluminium rate of 30%).

These figures show that the threshold voltage $V_T$ of the transistor 20 is much greater than 5 V and increases with the aluminium rate in the channel layer 23 made of AlGaN or with the thickness of the channel layer 23. This is due to the fact that the drift of the conduction bands between the GaN and the AlGaN (at the drift layer 22—channel layer 23 and channel layer 23—source contact layer 24 interfaces) increases with the aluminium rate or with the thickness of the channel layer 23.

A concentration in aluminium comprised between 20% and 40% and a thickness comprised between 10 nm and 20 nm constitute good compromises between a sufficiently high threshold voltage, facility of producing the control circuit of the transistor and current leakage in the OFF stated.

The p doping of the channel layer 23 provides an additional degree of adjustment of the threshold voltage $V_T$ of the transistor 20: the concentration in p-type doping impurities.

Two methods for manufacturing the field-effect transistor 20 according to FIG. 2 shall now be described. In these methods, it is considered that the transistor 20 comprises the source contact layer 24. However, this layer could be omitted.

FIGS. 6A to 6H diagrammatically show steps S11 to S18 of a first method of manufacturing.

This first method of manufacturing initially comprises the providing of a self-supporting substrate 21 made of III-N semiconductor material. This substrate 21 has a first face 21*a* of a nitrogen polarity ("N face") and a second face 21*b*, opposite the first face 21*a* and of polarity of the group III type ("group III face"). Its thickness is for example 400 μm.

The providing of the substrate 21 can comprise a growth operation of a layer of III-N semiconductor material on a host substrate, for example made of silicon, silicon carbide or sapphire, then an operation of removing the host substrate, for example by cutting or grinding.

The step S11 shown in FIG. 6A consists of successively forming by epitaxy the drift layer 22, the channel layer 23 and (advantageously) the source contact layer 24 on the first face 21*a* of the substrate 21.

Advantageously, the first face 21*a* of the substrate 21 is inclined with respect to the plane c ({0001}) of the hexagonal mesh structure by an angle comprised between 0.2° and 4° and preferably between 0.5° and 2° in the direction of the plane a ($\{11\bar{2}0\}$). This inclination reduces the number of growth defects (especially morphologically) in the epitaxial layers, in particular in the drift layer 22.

A metal layer, for example made of titanium or aluminium, can also be deposited on the source contact layer 24. This metal layer is intended to form a portion of the source electrode 25. The deposition of a portion of the source electrode 25 on the stack of epitaxial layers, immediately after the growth step, makes it possible to reduce the electrical resistance of the source electrode 25 and the contact resistance with the source contact layer 24.

The first method of manufacturing then comprises the formation of the gate structure 27 of the transistor.

In a preferred embodiment of the first method of manufacturing, the gate structure 27 is a MOS gate structure. Its formation advantageously comprises the steps S12 to S15 shown in FIGS. 6B to 6E.

In step S12 of FIG. 6B, a trench 28 is formed by etching a portion of the source contact layer 24 and of the channel layer 23 (and the metal layer where applicable) until the drift layer 22 is reached. A more or less thick upper portion of the drift layer 22 is also etched, as is shown in FIG. 6B.

The trench 28 has a bottom 28*a* and side walls 28*b*. The side walls 28*b* of the trench 28 preferably extend in a direction perpendicular to the first face 21*a* of the substrate 21.

The step S13 of FIG. 6C is an optional step consisting of forming a passivation layer 29, for example made of $SiO_2$, on the drift layer 22 at the bottom 28*a* of the trench 28 and on the source contact layer 24. The thickness of the passivation layer 29 is for example comprised between 100 nm and 800 nm.

The formation of the passivation layer 29 can comprise the following operations:

- nonconformal deposition of a passivation material, for example by plasma enhanced chemical vapour deposition (PECVD), in such a way as to form a layer of passivation material that is thicker on the bottom 28*a* of the trench 28 and on the source contact layer 24 than on the side walls 28*b* of the trench 28; and
- isotropic etch (for example wet etching) in such a way as to remove the passivation material on the side walls 28*b* of the trench 28.

Then, in S14 (FIG. 6D), the gate dielectric layer 27*a* is formed against the side walls 28*b* of the trench 28. The gate dielectric layer 27*a* can be formed from the same material as the passivation layer 29 (ex. made of $SiO_2$). On the other hand, its thickness is less than that of the passivation layer 29. It is for example comprised between 20 nm and 100 nm.

The gate dielectric layer 27*a* is advantageously formed by using a so-called high-temperature deposition technique, such as low pressure chemical vapour deposition (LPCVD) or atomic layer deposition (ALD). Compared to the other deposition techniques (in particular the PECVD technique used to form the passivation layer 29), these techniques make it possible to obtain a gate dielectric layer 27*a* of better quality, of a constant thickness (conformal deposition) and procures better control of its thickness.

In step S15 of FIG. 6E, the trench 28 is filled with an electrically conductive material, preferably a metal, to form the gate electrode 27*b*. The lower face of the gate electrode 27*b* is located at the same height as the lower face of the channel layer 23 or underneath (according to the depth of the trench 28, the thickness of the gate dielectric layer 27*a* and the thickness of the passivation layer 29). In other words, the gate electrode 27*b* extends vertically in the trench 28 beyond the channel layer 23.

In reference to FIG. 6D, the first method of manufacturing then comprises a step S16 of forming the source electrode 25 on the source contact layer 24. To this effect, one or more cavities are etched in the passivation layer 29 until the source contact layer 24 then these cavities are filled with electrically conductive material, preferably a metal.

The substrate 21 is advantageously thinned during a step S17 shown in FIG. 6G, for example until a thickness is reached comprised between 5 μm and 40 μm. The thinning is used to decrease the contribution of the substrate 21 to the series resistance of the component. This can be accomplished by grinding or by a technique called "spalling" and described in the document ["Kerf-less removal of Si, Ge, and III-V layers by controlled spalling to enable low-cost PV technologies", Stephen W. Bedell and al., IEEE Journal of Photovoltaics, Vol. 2, No. 2, pp. 141-147, 2012].

Finally, in step S18 of FIG. 6H, the drain electrode 26 is formed on the second face 21B of the substrate 21 (possibly thinned), preferably by deposition of a (or several) layers of metal. The drain electrode 26 can cover the entire surface area of the second face 21*b* of the substrate 21 ("full plate" deposition).

The growth by epitaxy on the N polarity face of a self-supporting substrate made of III-N semiconductor material (such as the substrate 21) is more difficult than the growth on a group III polarity face. Moreover, a self-supporting substrate with a GaN base often has a higher dislocation rate on the N face than on the Ga face.

Thus, in a second method of manufacturing of the transistor 20 shown in FIGS. 7A-7D, the growth by epitaxy is carried out in the inverse order on a group III polarity face, then the stack of epitaxial layers is turned over.

FIGS. 7A to 7D diagrammatically show steps S21 to S24 of this second method of manufacturing.

This second method of manufacturing first comprises the providing of a growth substrate 70 comprising a layer made of III-N semiconductor material, for example made of GaN or AlGaN. The growth substrate 70 comprises a first face 70*a* having a polarity of the group III type. The growth substrate 70 can be made of self-supporting substrate made of III-N semiconductor material, a solid substrate made of III-N semiconductor material or comprise a layer of III-N semiconductor material disposed on a support layer, for example made of sapphire, silicon carbide or silicon.

The step S21 of FIG. 7A consists of forming a stack 700 by successively growing by epitaxy, on the first face 70*a* of the growth substrate 70, the source contact layer 24, the channel layer 23, the drift layer 22 and a III-N semiconductor layer 71.

During the epitaxy, the growth substrate 70 is thus oriented differently from the substrate 21 used in the first method of manufacturing (step S11 of FIG. 6A). Due to this orientation, the face 71*a* of the III-N semiconductor layer 71 in contact with the drift layer 22 has an N-type polarity. The III-N semiconductor layer 71 of FIG. 7A thus corresponds to the substrate 21 of FIG. 6G. Its thickness is preferably comprised between 0.5 μm and 2 μm. It is preferably n-type doped ($10^{17}$ $cm^{-3}$-$10^{20}$ $cm^{-3}$).

In step S22 of FIG. 7B, at least one metal layer is then deposited on the III-N semiconductor layer 71 to form the drain electrode 26. This metal layer is also intended to be used as a adhesion layer.

In S23 (FIG. 7C), the stack 700 is turned over then glued to a transfer substrate 72 on the side of the drain electrode 26. The transfer substrate 72 is advantageously made of metal, for example of copper, so as to improve the thermal dissipation of the transistor 20 and the electrical conductivity of the drain electrode 26. The adhesion is then of the metal-metal direct type (without any addition of material).

In step S24 of FIG. 7D, the growth substrate 70 is removed in such a way as to expose the source contact layer 24, for example by grinding or laser "lift-off".

Finally, the gate structure 27 and the source electrode 25 of the transistor 20 are formed, preferably in the way described in relation with FIGS. 6B to 6F (steps S12 to S16).

This second method of manufacturing has the advantage of limiting the growth defects in the structure (vertical) of the transistor 20. It is however longer to implement.

Advantageously, the stack 700 further comprises a barrier layer 73, formed by epitaxy on the first face 70*a* of the growth substrate 70 before the source contact layer 24 (or the channel layer 23). This barrier layer 73, for example made of AlGaN, facilitates the removal of the growth substrate 70. Indeed, the growth substrate 70 is then removed in two steps, first by grinding or laser lift-off over several hundred micrometres, then the remaining thickness is removed by etching by stopping on the barrier layer 73. At the end of the step of removing the growth substrate 70, the layer 73 is removed by etching with stopping on the source contact layer 24 (or on the channel layer 23).

A piezoelectric interface charge between the drift layer and the channel layer can also be obtained in a field-effect transistor (vertical) with a p channel (p-FET), by disposing these layers on the group III polarity face of the III-N semiconductor layer 21/71.

Thus, another aspect of the invention relates to a p-channel field-effect transistor, comprising:

- a III-N semiconductor layer comprising a first face and a second face opposite the first face, the first face having a polarity of the group III type;
- a drift layer disposed on the first face of the III-N semiconductor layer;
- a channel layer disposed on the drift layer, the channel layer forming a heterostructure with the drift layer;
- preferably, a source contact layer disposed on the channel layer;
- a gate structure extending to the drift layer through the channel layer and, where applicable, the source contact layer;
- a source electrode disposed on the channel layer, or where applicable, on the source contact layer; and
- a drain electrode disposed on the second face of the III-N semiconductor layer.

The III-N semiconductor layer, the drift layer and the source contact layer of the p-FET transistor a p-type doped, rather than n-type doped. In blocking and in conducting, the drain electrode of the transistor p-FET is negatively polarised (not positively as in the case of an n-FET transistor).

The invention claimed is:

1. A field-effect transistor comprising:

a III-N semiconductor layer comprising a first face and a second face opposite the first face;

a drift layer disposed on the first face of the III-N semiconductor layer;

a channel layer disposed on and in contact with the drift layer, the channel layer consisting of p-doped or unintentionally doped aluminium gallium nitride (AlGaN);

a gate structure extending to the drift layer through the channel layer;

a source electrode disposed on the channel layer; and a drain electrode disposed on the second face of the III-N semiconductor layer;

wherein the first face of the III-N semiconductor layer has a polarity of the nitrogen type, wherein the drift layer is made of n-doped gallium nitride (GaN), wherein the aluminium gallium nitride (AlGaN) of the channel layer has a percentage of aluminium comprised between 20% and 40%, wherein the channel layer forms a heterostructure with the drift layer, wherein a negative piezoelectric interface charge at the interface between the drift layer and the channel layer creates a potential barrier that increases the threshold voltage of the field-effect transistor, and wherein the threshold voltage of the field-effect transistor is comprised between 14 V and 37 V.

2. The field-effect transistor according to claim 1, wherein the III-N semiconductor layer is made of gallium nitride (GaN) or aluminium gallium nitride (AlGaN).

3. The field-effect transistor according to claim 1, wherein the channel layer has a thickness comprised between 10 nm and 20 nm.

4. The field-effect transistor according to claim 2, wherein the drift layer is made of n-doped aluminium gallium nitride (AlGaN).

5. The field-effect transistor according to claim 2, wherein the drift layer is made of n-doped aluminium gallium nitride (AlGaN) and the channel layer has a percentage of aluminium greater than that of the drift layer.

6. The field-effect transistor according to claim 1, further comprising a source contact layer disposed between the channel layer and the source electrode.

7. The field-effect transistor according to claim 6, wherein the source contact layer is made of n-type doped gallium nitride (GaN).

8. A method for manufacturing a field-effect transistor, comprising:

providing a substrate made of a III-N semiconductor material, the substrate comprising a first face having a polarity of the nitrogen type and a second face opposite the first face;

forming successively by epitaxy a drift layer and a channel layer on the first face of the substrate, the channel layer forming a heterostructure with the drift layer, the channel layer consisting of p-doped or unintentionally doped aluminium gallium nitride (AlGaN);

forming a gate structure extending to the drift layer through the channel layer;

forming a source electrode on the channel layer; and forming a drain electrode on the second face of the substrate, wherein the drift layer is made of n-doped gallium nitride (GaN), wherein the aluminium gallium nitride (AlGaN) of the channel layer has a percentage of aluminium comprised between 20% and 40%, wherein a negative piezoelectric interface charge at an interface between the drift layer and the channel layer creates a potential barrier that increases the threshold voltage of the field-effect transistor, and wherein the threshold voltage of the field-effect transistor is comprised between 14 V and 37 V.

9. The method according to claim 8, further comprising thinning the substrate before forming the drain electrode.

10. A method for manufacturing a field-effect transistor, comprising:

providing a growth substrate comprising a layer made of a III-N semiconductor material, the growth substrate comprising a first face having a polarity of the group III type;

forming a stack by successively growing by epitaxy a channel layer, a drift layer and a III-N semiconductor layer on the first face of the growth substrate, the channel layer forming a heterostructure with the drift layer, the channel layer consisting of p-doped or unintentionally doped aluminium gallium nitride (AlGaN);

depositing at least one metal layer on the III-N semiconductor layer to form a drain electrode;

turning over the stack and gluing the stack to a transfer substrate on a side of the drain electrode;

removing the growth substrate;

forming a gate structure extending to the drift layer through the channel layer; and forming a source electrode on the channel layer, wherein the drift layer is made of n-doped gallium nitride (GaN), wherein the aluminium gallium nitride (AlGaN) of the channel layer has a percentage of aluminium comprised between 20% and 40%, wherein a negative piezoelectric interface charge at an interface between the drift layer and the channel layer creates a potential barrier that increases the threshold voltage of the field-effect transistor, and wherein the threshold voltage of the field-effect transistor is comprised between 14 V and 37 V.

11. The method according to claim 10, wherein the transfer substrate is made of metal.

12. The method according to claim 10, wherein the stack further comprises a barrier layer formed by epitaxy on the first face of the growth substrate before the channel layer.

13. The method according to claim 12, wherein the barrier layer is made of aluminium gallium nitride (AlGaN).

* * * * *